United States Patent [19]

Hollinger, II

[11] Patent Number: 5,115,905
[45] Date of Patent: May 26, 1992

[54] MAGNETICALLY SECURED CONVEYOR SYSTEM FOR PRINTED CIRCUIT ASSEMBLIES

[75] Inventor: Lawrence E. Hollinger, II, Houston, Tex.

[73] Assignee: Compaq Computer Corporation, Houston, Tex.

[21] Appl. No.: 742,096

[22] Filed: Aug. 2, 1991

Related U.S. Application Data

[63] Continuation of Ser. No. 538,106, Jun. 14, 1990, abandoned.

[51] Int. Cl.⁵ .............................................. B65G 49/00
[52] U.S. Cl. ................... 198/465.1; 198/472.1; 198/803.6; 198/803.01
[58] Field of Search ............ 198/465.1, 472.1, 690.1, 198/803.6, 803.01, 698, 848

[56] References Cited

U.S. PATENT DOCUMENTS

| | | | |
|---|---|---|---|
| 1,453,022 | 4/1923 | Philips | 198/803.6 |
| 1,841,339 | 1/1932 | Schroder | 198/698 |
| 2,136,363 | 11/1938 | Hume et al. | 198/698 |
| 2,372,685 | 4/1945 | Schaich | 198/803.6 X |
| 2,806,396 | 9/1957 | Miller | 198/803.6 X |
| 3,107,001 | 10/1963 | Kotraba | 198/803.01 X |
| 3,357,559 | 12/1967 | Israelson | 198/690.1 X |
| 3,526,207 | 9/1970 | Nadelson | 198/848 X |
| 3,578,144 | 5/1971 | Punzak | 198/803.01 |
| 3,621,979 | 11/1971 | Kraeft | 198/803.01 |
| 3,631,962 | 1/1972 | Mason et al. | 198/803.6 X |
| 3,633,737 | 1/1972 | Magaldi | 198/848 |
| 3,734,269 | 5/1973 | Ross | 198/698 |
| 3,750,862 | 8/1973 | Knipe | 198/698 |
| 3,767,034 | 10/1973 | Teagle | 198/848 X |
| 3,871,510 | 3/1975 | Homeier | 198/803.01 |
| 4,635,788 | 1/1987 | McDonald | 198/848 |
| 4,643,129 | 2/1987 | Sari | 198/848 X |
| 4,697,693 | 10/1987 | Rasala et al. | 198/698 X |
| 4,850,542 | 7/1989 | Rechsteiner | 198/690.1 X |

FOREIGN PATENT DOCUMENTS

| | | | |
|---|---|---|---|
| 0120140 | 10/1984 | European Pat. Off. | 198/803.6 |
| 0113172 | 9/1979 | Japan | 198/690.1 |
| 1437310 | 11/1988 | U.S.S.R. | 198/688.1 |

*Primary Examiner*—D. Glenn Dayoan
*Attorney, Agent, or Firm*—Christopher D. Keirs

[57] ABSTRACT

An improvement to a conveyor system is disclosed which comprises a system of magnets and removable ferromagnetic strips which may be easily attached to Printed Circuit Assemblies (PCA's). In one preferred embodiment, the magnets are mounted to brackets which are bolted to the conveyor chain. These magnet assemblies act to secure the PCA's which have clip-on stiffeners affixed to their leading edges. The PCA's are thereby prevented from sliding on the conveyor chain as it moves up and down inclines. The likelihood of damage to PCA's on the conveyor system is thus reduced. The PCA's are released from the magnet assemblies by the shearing action produced by the conveyor chain as it rounds the return roller at the end of the coveyor line.

11 Claims, 4 Drawing Sheets

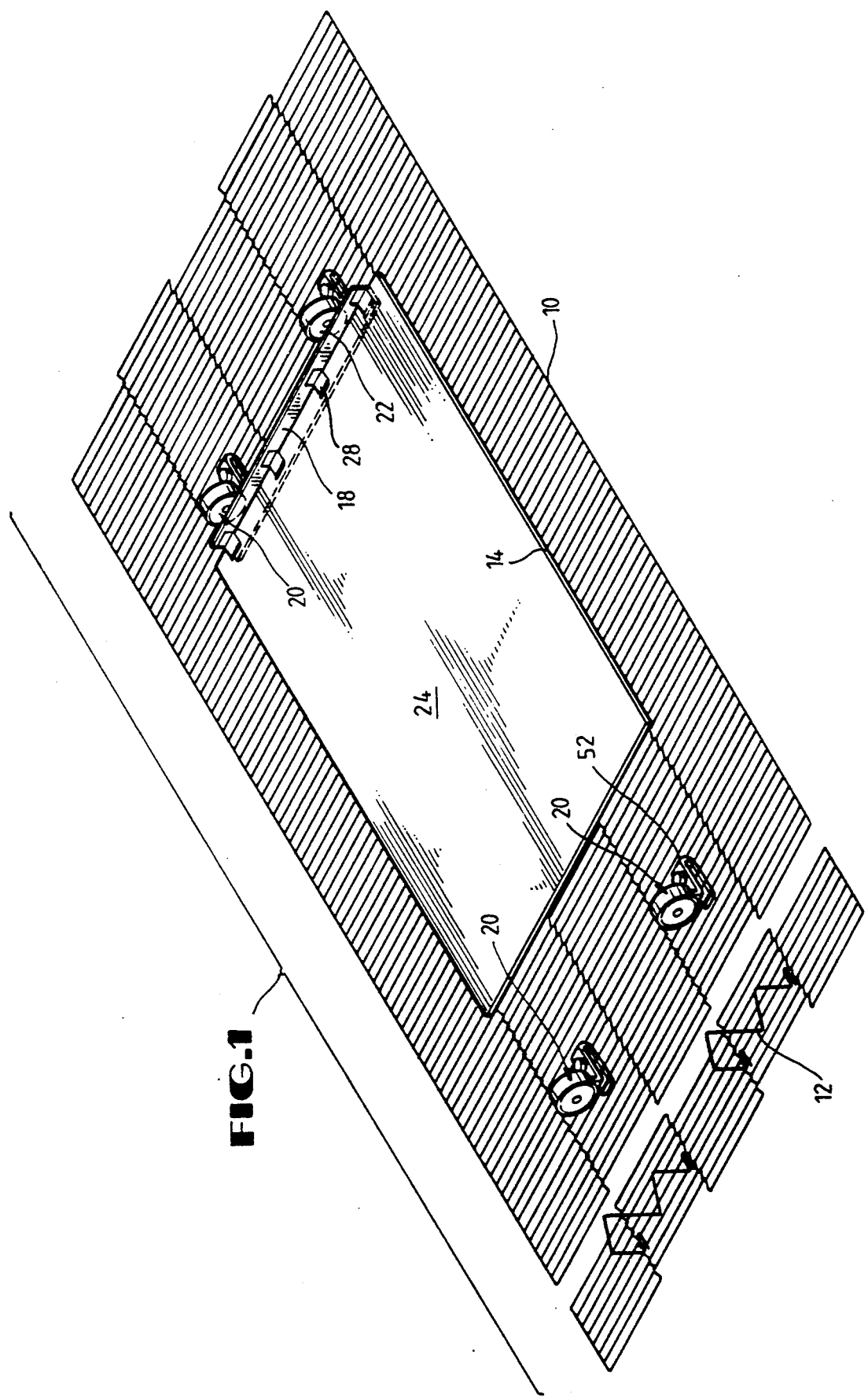

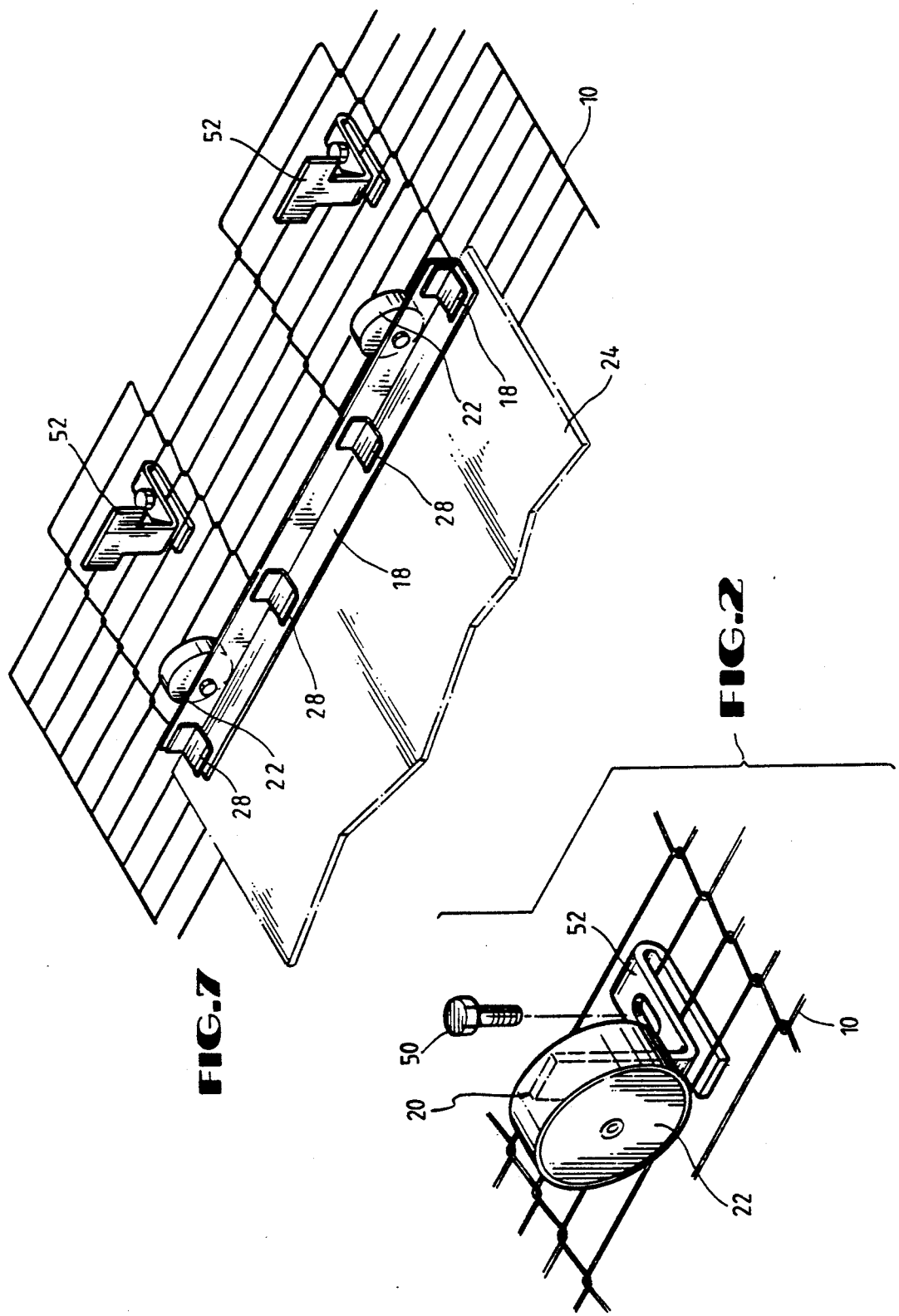

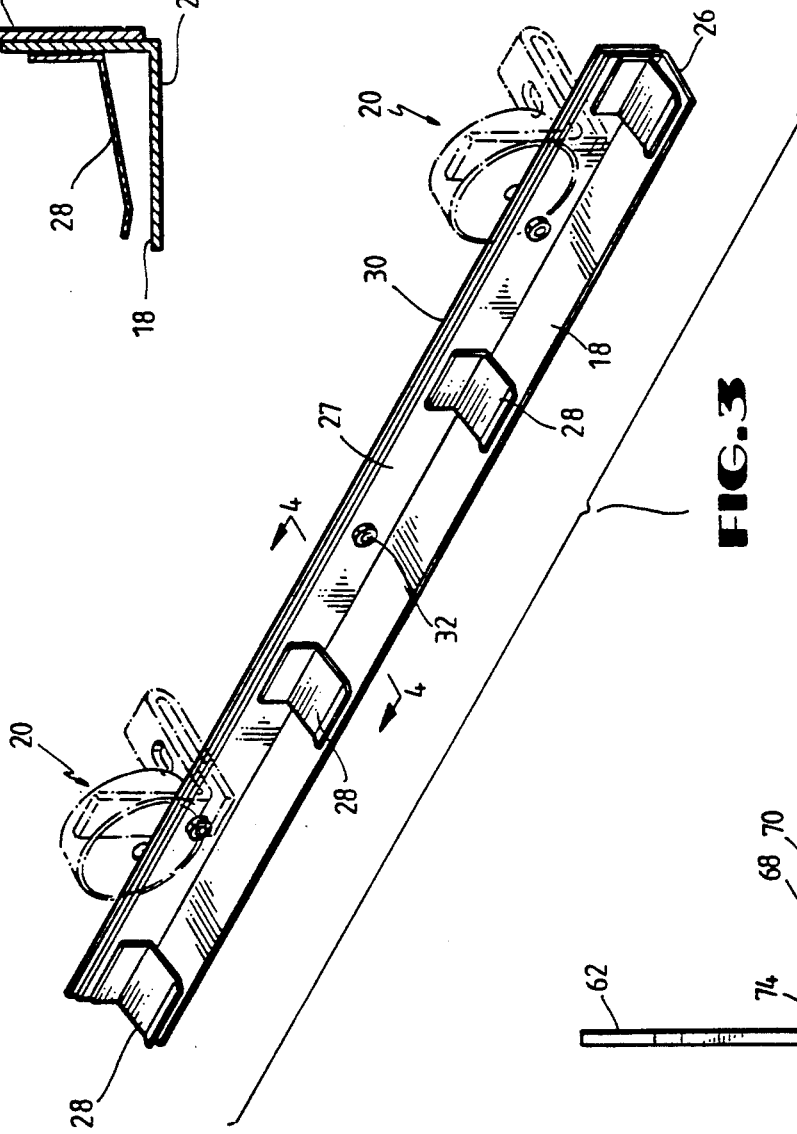

MAGNETICALLY SECURED CONVEYOR SYSTEM FOR PRINTED CIRCUIT ASSEMBLIES

This is a continuation of co-pending application Ser. No. 538,106 filed Jun. 14, 1990 now abandoned.

BACKGROUND OF THE INVENTION

1. Field of the Invention

This invention relates to conveyor systems. More particularly, it relates to conveyors for printed circuit assemblies which traverse inclines. Such conveyor systems are often utilized in connection with solvent baths used for cleaning printed circuit boards following a wave soldering operation.

2. Description of the Related Art

Conveyor systems used to transport printed circuit assemblies (PCA's) into and through solvent cleaning baths typically employ conveyor belts having an open mesh design. This design permits the solvent to contact nearly 100% of all surfaces of the PCA when it is immersed in the solvent bath thereby providing a more thorough cleaning than would be possible if an impervious conveyor belt were used.

One such conveyor belt or chain is shown as 10 in FIG. 1. The conveyor chain illustrated is Part No. 1329 (from Wire Belt Company of America, Winchester, Mass. for the Baron-Blakeslee cleaner Model CBL-18 (Baron-Blakeslee Division, Allied-Signal, Inc., Chicago, Ill. It comprises an interlocked set of stainless steel links which form an endless belt. The conveyor chain is arranged in a loop configuration within an automatic solvent cleaning apparatus for PCA's. The conveyor chain is additionally equipped with clip-on wire bails 12 which segment the chain into "flights". The length of the flights can be selected by varying the positions of the wire bails.

Inasmuch as the conveyor chain travels up and down inclines as it moves PCA's into and out of the solvent bath or solvent cleaning section of the apparatus, it is necessary to equip the conveyor chain with the above-described wire bails to provide a positive stop for the PCA's. Without such stops, the PCA's could slide on the inclined portions of the conveyor and either stop moving through the apparatus altogether or jam the mechanism.

It will be appreciated by those skilled in the art that the wire bails 12 must be placed so as to accommodate the longest PCA's that will be placed on the conveyor chain. As a result, shorter PCA's can slide on the conveyor chain between the leading wire bails and the following set of bails which defines the next flight. Such sliding has been found to damage leads which project on the underside of the PCA's as well as components mounted on that side of the printed circuit board. Given the trend towards ever higher circuit densities, designers are placing more and more components on the "solder side" of printed circuit boards. As a result, the likelihood of damage occurring when a PCA slides on the surface of a conveyor chain increases for high density circuit boards. The present invention solves this problem.

SUMMARY OF THE INVENTION

The invention comprises a system of magnets and removable ferromagnetic strips which may be easily attached to PCA's. In one preferred embodiment, the magnets are mounted to brackets which are bolted to the conveyor chain. These magnet assemblies act to secure the PCA's which have clip-on stiffeners affixed to their leading edges. The PCA's are thereby prevented from sliding on the conveyor chain as it moves up and down inclines. The likelihood of damage to PCA's on the conveyor system is thus reduced. The shearing action produced by the conveyor chain as it rounds the return roller at the end of the conveyor line has been found to be sufficient to release PCA's of average size and weight.

BRIEF DESCRIPTIONS OF THE DRAWINGS

FIG. 1 is an isometric view of a portion of a conveyor chain equipped with the apparatus of the present invention. A printed circuit assembly is shown in position on the conveyor.

FIG. 2 shows a magnet assembly of the present invention attached to a conventional conveyor chain.

FIG. 3 shows a magnetic PCA stiffener of the present invention attached to a pair of magnetic flight assemblies.

FIG. 4 is a cross sectional view of a magnetic PCA stiffener taken along line 4—4 in FIG. 3.

FIGS. 5A and 5B shows front and side views, respectively, of one preferred embodiment of a magnet support bracket for use in the present invention.

FIG. 7 shows an alternative embodiment of the invention wherein magnets are affixed to the PCB stiffener and the flight brackets are formed of magnetically susceptible material.

DETAILED DESCRIPTION

Figure 6:
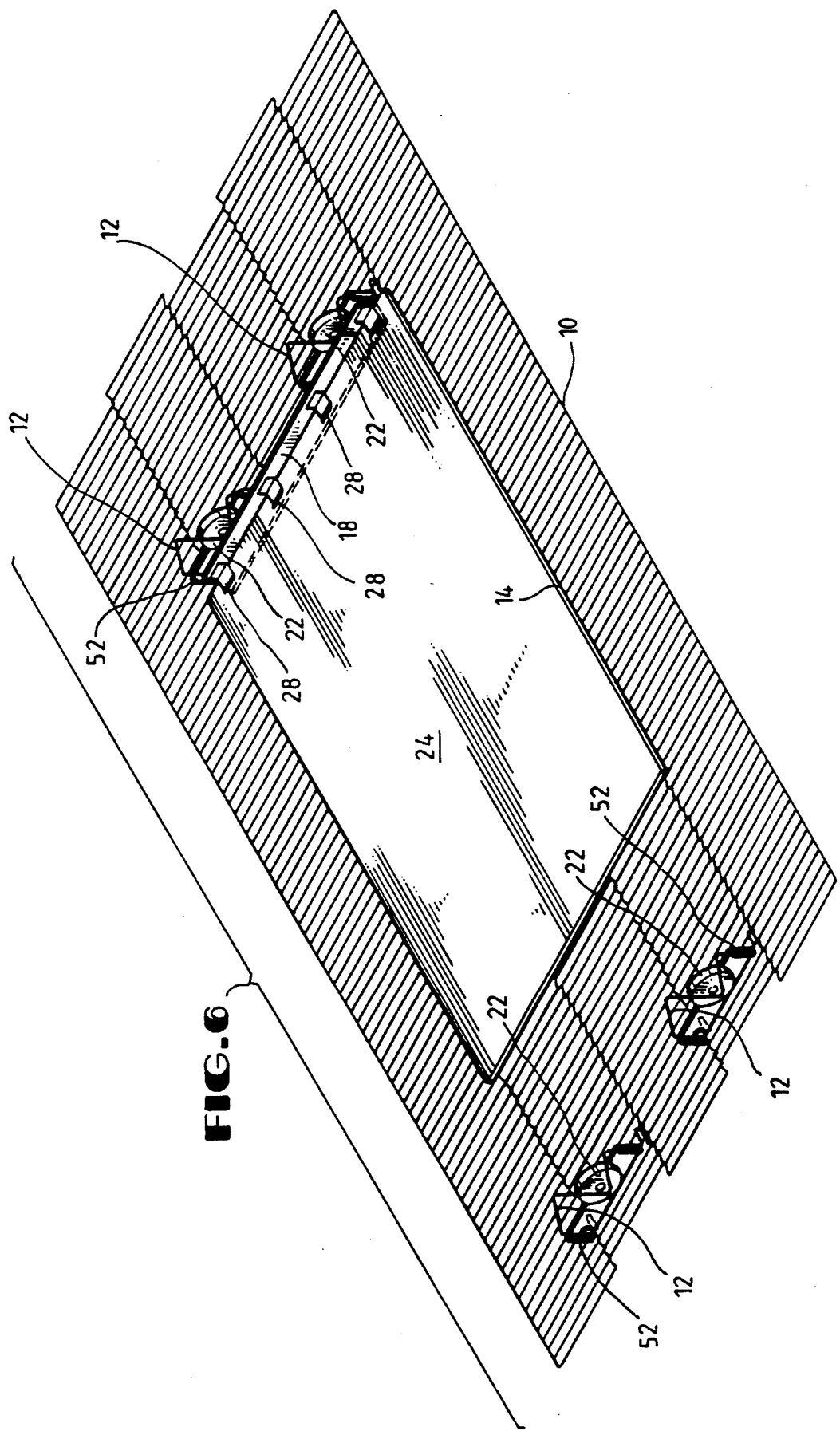
FIG. 6 shows an alternative embodiment of the invention wherein the flight brackets which secure the magnets are attached to conventional wire bails.

Most conveying devices which transport PCA's through wave soldering machines support the printed circuit boards by those edges of the board which are parallel to the direction of the board's travel through the apparatus. Such edges are shown as 14 in FIG. 1. It has been found, however, that the heat of the wave solder bath causes PCA's to bow as they pass through the solder wave. Such bowing is undesirable in that it renders the solder side of the board nonplanar thereby causing the center portion of the printed wiring board to be immersed in the solder to a greater extent than the edges of the board. When this condition obtains, it is not possible to produce consistent soldering action. Accordingly, it has been found necessary to equip printed circuit boards with stiffeners prior to their entry into the machine soldering apparatus. A typical, clip-on stiffener is shown as 18 in FIGS. 1 and 3. A PCA 24 with stiffener 18 attached is shown on conveyor belt 10 in FIG. 1.

As may be best seen in FIG. 3, stiffener 18 includes a plurality of clips 28 for securing the printed wiring board to stiffener 18. In use, the leading edge of PCA 24 is inserted between clips 28 and lower portion 26 of stiffener 18. Preferably, clips 28 have a spring action in the direction of lower portion 26 so as to provide a gripping effect which secures board 24 to stiffener 18. In one preferred embodiment, stiffener 18 is fabricated of titanium which provides lightweight strength and corrosion resistance.

In the present invention, magnets are used to releasably attach the PCA to the belt of the conveyor system. Accordingly, it is necessary to either affix magnets to the PCA and provide the conveyor with attachment points of magnetically attracted material or, alternatively, to equip the PCA's with magnetically attracted material and provide magnets on the conveyor. The later strategy is adopted in the embodiment shown in the drawing figures. Generally, magnets are more fragile than magnetically attracted material and hence it is advantageous to place the magnets on conveyor 10 rather than on stiffener 18 inasmuch as the stiffeners are subjected to repeated handling whereas the conveyor belt is not. Moreover, magnets which extend both above and below the plane of the printed wiring board can be accommodated on the mesh-type conveyor belt 10 shown in FIG. 1. In contrast, attaching magnets taller than the stiffener could cause problems with the use of the stiffener in the wave soldering machine.

One preferred embodiment of magnetic flight assembly 20 is depicted in FIG. 2. Flight bracket 52 is sized to fit conveyor chain 10 and may be constructed of any suitable material. In the embodiment illustrated, flight bracket 52 is made of stainless steel for corrosion resistance. The bottom of flight bracket 52 is preferably curved as shown to fit between the links of conveyor chain 10. Flight bracket 52 is attached to chain 10 using bolt and washer combination 50 as shown in FIG. 2. It will be appreciated that other equivalent means of attachment may be used. Magnet 22 is attached to flight bracket 52. In the embodiment shown in the drawing figures, magnet 22 is round and attached to flight bracket 52 with a stainless steel pop rivet. Other, equivalent attachment means may, of course, be used. A shallow pot, permanent field, ceramic magnet rated at a pull strength of 12 pounds has been found suitable for this application. Most preferably, magnet 22 is of sufficient strength to prevent any sliding of PCA 24 on conveyor belt 10 but not so strong as to prevent release of the PCA at the end of the conveyor line.

One preferred magnet support bracket is shown in FIG. 5. FIG. 5A is a front view of a magnet bracket; FIG. 5B is a side view thereof. Magnet bracket 60 includes vertical portion 62 and clip portion 66. Bracket 60 may be constructed of any suitable material; 304 stainless steel is particularly preferred. Vertical portion 62 includes magnet attachment hole 64 through which a bolt, rivet or similar fastener may be conveniently passed to secure a magnet (not shown) to magnet support bracket 60. Solvent drain hole 74 prevents the pooling of solvent behind vertical portion 62.

Bracket 60 further includes clip portion 66 which is bent 180 degrees to form U-shaped channel 70 into which the links of conveyor chain 10 fit as shown in FIG. 1. Clip portion 66 is equipped with bracket attachment hole 68. Press fit nut 72 is inserted into the lower portion of attachment hole 68. To secure bracket 60 to conveyor chain 10a suitable sized bolt (not shown) may be passed through the upper portion of attachment hole 68 and threaded into nut 72.

Magnetically attracted stiffener 18 is shown in combination with a pair of magnetic flight assemblies 20 in FIG. 3 and in cross section in FIG. 4 along the line 4—4 indicated in FIG. 3. A conventional stiffener is used which is formed of a titanium angle bracket comprising lower portion 26 and upright portion 27. As noted previously, clips 28 are mounted on upright portion 27 and act to grip the PCA between the clip and lower portion 26. Since titanium is not magnetically attracted, it is necessary to modify the stiffener by adding magnetically attracted material so that in use it may be secured to magnets 22. In the embodiment illustrated, this is done by adding magnetically attracted strip 30 to the leading edge of stiffener 18 (i.e., the side of upright portion 27 opposite the side to which clips 28 are attached. In the embodiment illustrated, magnetically attracted strip 30 is formed of alloy 430 stainless steel and is mounted to the stiffener with bolt and nut combinations 32. Other equivalent materials and attachment means will be readily apparent to those skilled in the art. Most preferably, strip 30 will be formed of a corrosion resistant, magnetically attracted material which has a thermal coefficient of expansion sufficiently close to that of the stiffener to prevent bowing of the stiffener when it is subjected to the heat of the wave soldering apparatus. Of course, if the stiffener (or even if its upright portion 27 alone) is constructed of magnetically attracted material, it will be unnecessary to add strip 30.

Referring again to FIG. 1, the operation of the present invention will be described. Conveyor 10 is equipped with pairs of magnetic flight assemblies 20 at intervals selected according to the length of the PCA's to be conveyed. Typically, the spacing between magnetic flight assemblies will be about 4 inches greater than the length of the PCA's. The PCA's will have magnetically attracted stiffeners 18 manually affixed to their leading edges prior to entering the machine soldering apparatus. As the PCA's exit the machine soldering device, they are moved via another conveyor towards conveyor belt 10. When stiffener 18 contacts magnetic flight assemblies 20 it becomes securely attached to the conveyor 10 and is prevented from sliding on the surface of belt 10 even on inclined portions of the conveyor system.

When magnetic flight assemblies 20 reach the roller at the end of the conveyor line, magnets 22 are released from magnetically attracted stiffener 18 by the prying or shearing action which results from belt 10 rounding the roller. PCA 24 is then pushed off conveyor belt 10 and magnetically attracted stiffener 18 is subsequently manually removed from PCA 24 and reused.

The foregoing description has been directed to particular embodiments of the invention in accordance with the requirements of the U.S. patent statutes for the purposes of illustration and explanation. It will be apparent to those skilled in this art, however, that many modifications and changes in the apparatus and methods set forth will be possible without departing from the scope and spirit of the invention. It is intended that the following claims be interpreted to embrace all such modifications and changes.

What is claimed is:

1. A conveyor system comprising:
    a conveyor belt;
    at least one magnet attached to the conveyor belt such that the major axis of the lines of magnetic flux is substantially perpendicular to the surface of the conveyor belt;
    a printed circuit assembly having a magnetically attracted assembly affixed to at least one edge such that when conveyed on the conveyor belt the magnetically attracted assembly is in contact with the magnet.

2. A conveyor system as recited in claim 1 wherein the conveyor belt comprises a wire mesh and the magnet is attached thereto by means of clips which engage the wire mesh.

3. A conveyor system as recited in claim 1 wherein the magnetically attracted assembly comprises a clip-on printed circuit board stiffener.

4. A conveyor system as recited in claim 1 wherein the magnetically attracted assembly comprises a clip-on printed circuit board stiffener having a strip of magnetically attracted material affixed to at least one edge thereof.

5. A conveyor system as recited in claim 4 wherein the magnetically attracted material is 400 series stainless steel.

6. A conveyor system as recited in claim 1 wherein the magnet is attached to a wire bail projecting from the surface of the conveyor belt.

7. A conveyor system comprising:
 a conveyor belt;
 at least one magnetically attracted stop attached to the conveyor belt substantially perpendicular to the surface of the conveyor belt;
 a printed circuit assembly having a magnet releasably affixed to at least one edge such that when the printed circuit assembly is lying on the conveyor belt the magnet is in contact with the magnetically attracted stop and the major axis of the lines of magnetic flux is substantially perpendicular to the surface of the conveyor belt.

8. A conveyor system as recited in claim 7 wherein the conveyor belt comprises a wire mesh and the magnetically attracted stop is attached thereto by means of clips which engage the wire mesh.

9. A conveyor system as recited in claim 7 wherein the magnet is affixed to a clip-on printed circuit board stiffener.

10. A conveyor system as recited in claim 7 wherein the magnetically attracted stop is at least partially fabricated from 400 series stainless steel.

11. A conveyor system as recited in claim 7 wherein the magnetically attracted stop is attached to a wire bail projecting from the surface of the conveyor belt.

* * * * *